(12) United States Patent
Shabtai et al.

(10) Patent No.: US 10,905,017 B2
(45) Date of Patent: Jan. 26, 2021

(54) FABRICATION OF PCB AND FPC WITH SHIELDED TRACKS AND/OR COMPONENTS USING 3D INKJET PRINTING

(71) Applicants: Nano Dimension Technologies, LTD, Nes Ziona (IL); THE IP LAW FIRM OF GUY LEVI, LLC, Wyckoff, NJ (US)

(72) Inventors: Avi Shabtai, Tel Aviv (IL); Michael Partosh, Ashdod (IL)

(73) Assignee: Nano Dimension Technologies Ltd., Nes-Ziona (IL)

( * ) Notice: Subject to any disclaimer, the term of this patent is extended or adjusted under 35 U.S.C. 154(b) by 256 days.

(21) Appl. No.: 16/088,800

(22) PCT Filed: Mar. 27, 2017

(86) PCT No.: PCT/US2017/024363
§ 371 (c)(1),
(2) Date: Sep. 26, 2018

(87) PCT Pub. No.: WO2017/172642
PCT Pub. Date: Oct. 5, 2017

(65) Prior Publication Data
US 2020/0315035 A1    Oct. 1, 2020

Related U.S. Application Data

(60) Provisional application No. 62/313,761, filed on Mar. 27, 2016.

(51) Int. Cl.
| | | |
|---|---|---|
| H05K 3/46 | (2006.01) | |
| B33Y 10/00 | (2015.01) | |
| B33Y 30/00 | (2015.01) | |
| B33Y 50/02 | (2015.01) | |
| B33Y 70/00 | (2020.01) | |
| B33Y 80/00 | (2015.01) | |
| B29C 64/112 | (2017.01) | |
| B29C 64/393 | (2017.01) | |
| B22D 23/00 | (2006.01) | |
| H05K 1/02 | (2006.01) | |
| H05K 3/00 | (2006.01) | |
| H05K 3/12 | (2006.01) | |
| B29L 31/34 | (2006.01) | |

(52) U.S. Cl.
CPC ......... *H05K 3/4664* (2013.01); *B22D 23/003* (2013.01); *B29C 64/112* (2017.08); *B29C 64/393* (2017.08); *B33Y 10/00* (2014.12); *B33Y 30/00* (2014.12); *B33Y 50/02* (2014.12); *B33Y 70/00* (2014.12); *B33Y 80/00* (2014.12); *H05K 1/0221* (2013.01); *H05K 3/0005* (2013.01); *H05K 3/125* (2013.01); *B29K 2995/0007* (2013.01); *B29L 2031/3425* (2013.01); *H05K 2203/013* (2013.01)

(58) Field of Classification Search
CPC .......................... H05K 1/0215; H05K 1/0298
See application file for complete search history.

(56) References Cited

U.S. PATENT DOCUMENTS

| | | | | |
|---|---|---|---|---|
| 2013/0286609 A1* | 10/2013 | Merz | ..................... | C23C 14/086 361/760 |
| 2016/0141232 A1* | 5/2016 | Cannon | ................. | H01L 23/552 257/659 |
| 2017/0311448 A1* | 10/2017 | Kawabata | ............. | H01F 1/0306 |

* cited by examiner

*Primary Examiner* — Austin Murata
(74) *Attorney, Agent, or Firm* — Guy Levi; The IP Law Firm of Guy Levi, LLC

(57) ABSTRACT

The disclosure relates to methods and compositions for direct printing of circuit boards having an electromagnetically-shielded tracks and/or components. Specifically, the disclosure relates to the direct, uninterrupted and continuous 3D printing of insulation-jacketed tracks and/or components with metallic shielding sleeves or capsule.

21 Claims, 3 Drawing Sheets

FABRICATION OF PCB AND FPC WITH SHIELDED TRACKS AND/OR COMPONENTS USING 3D INKJET PRINTING

CROSS REFERENCE TO RELATED APPLICATIONS

This patent application is a U.S. National Phase filing of, commonly owned PCT Application No. PCT/US2017/024363, filed Mar. 27, 2017, which claims priority from U.S. Provisional Application No. 62/313,761, filed 26 Mar. 2016 both which are incorporated herein by reference in their entirety.

BACKGROUND

The disclosure is directed to methods and compositions for direct printing of circuit boards having an electromagnetically-shielded tracks and/or components. Specifically, the disclosure is directed to the direct and continuous 3D printing of insulation-jacketed tracks and/or components with metallic shielding sleeves or capsule.

Over the past few years, Printed circuit board (PCB) layout has become more complex as demand for device pin density and system frequency increase. A successful high-speed board must therefore effectively integrate many devices and other elements while avoiding signal transmission problems (e.g., signal integrity) associated with high-speed I/O standards. Printed circuit boards (PCBs) and flexible circuitry (e. g., flexible printed circuitry or FPCs) can contain an array of passive and active components, chips (flip chip, bare die, and the like), grounding planes, traces, and connector leads. Current PCBs and FPCs contain high-speed processors and specialized chips having speeds of one gigahertz and higher for processing digital information and switching. Unfortunately, these microprocessors and chips can produce and be disrupted by electromagnetic interference (EMI), electrostatic discharge (ESD), and radiofrequency interference (RFI). (As subsequently used herein "EMI" shall include ESD, RFI, and any other type of electromagnetic emission or effect.) In addition, emitted electromagnetic radiation can interfere with other components and emission levels are restricted by law.

One of the major problems in high density, high-speed PCBs with relatively long tracks, is crosstalk (see e.g., FIGS. 1-2). Crosstalk refers to the unintended electromagnetic coupling or interference (EMI) between traces, wires, trace-to-wire, cable assemblies, components subject to electromagnetic field disturbance or their combination within the PCB or FPC. Crosstalk involves both capacitive and inductive coupling. Capacitive coupling usually results when one trace lies on top of another trace. This coupling is a direct function of the distance spacing between the trace and an overlap area. Coupled signals may exceed design limits with a very short trace route. This coupling may be so severe that overlapping parallelism becomes prohibitive, imposing constraints on the PCB design thus reducing volume efficiencies. Inductive coupling involves traces that are physically located in close proximity to each other. With two traces adjacent to each other, Current flows down one of the trace are aggressor or driven line.

Current mitigation techniques are, for example (see e.g., FIGS. 3-4), to minimize physical distance between the components during placement; to minimize parallel, cross and overlap routed traces lengths; to group logic families according to functionality; to position components away from I/O interconnects and other areas susceptible to data corruption and coupling; to avoid routing of traces parallel to each other; to route adjacent layers orthogonal; to reduce trace (track) impedance and signal drive level; to reduce signal to ground reference distance separation (e.g., by incorporating additional ground connectors within the PCB); to partition or isolate high noise emitters onto different layers within stack up assignments (and separate those by ground connectors e.g. or separate those with vias if in the same layer); and/or provide termination on impedance-controlled traces, or traces rich in RF harmonic energy; or a combination of these mitigation methods.

In addition controlling the electromagnetic interference can be accomplished through various means, including the use of metal housings ("cans"), metal-filled polymer housings, and metal liners for housings. Metal coatings on electronic housings are applied with conductive paints or metal plates, and adhere through chemical plating (electroless plating), or electroplating. Metal foils or liners with adhesive backings can be applied to the inside of the housing to enable electronic instruments to meet shielding requirements. Unfortunately, each of the conventional solutions for EMI shielding for PCBs and FPCs have shortcomings. For example, plating is costly, complex and is limited to certain polymer resins. While silver paints have the good electrical properties, silver paint is extremely expensive. Nickel paints can be used for relatively low attenuation applications, but is limited by its high resistance and poor stability. Most importantly, the painting process has difficulties with flaking, cracking, and coating uniformity in recesses and creases These mitigation/shielding methods clearly impose substantial constraints on PCB design, increase its cost, size and reduce its integrity and strength due to extensive use of vias. Accordingly there clearly is a need for improving crosstalk mitigation and EMI shielding of traces and components within PCBs.

SUMMARY

Disclosed, in various embodiments, are methods of forming or fabricating PCB's and or FPC's having shielded traces and/or components comprising metal and insulating resin using inkjet printing, for the direct, uninterrupted and continuous 3D printing of insulation-jacketed tracks and/or components with metallic shielding sleeves or capsule.

In an embodiment provided herein is a method for fabricating a printed circuit board (PCB), having an electromagnetically-shielded track using inkjet printer comprising: providing an ink jet printing system comprising: a first print head having: at least one aperture, an insulating resin ink reservoir, and an insulating resin pump configured to supply the insulating resin inkjet ink through the aperture; a second print head having: at least one aperture, a first metallic ink reservoir, and a first metallic ink pump configured to supply the first metallic inkjet ink through the aperture; a conveyor, operably coupled to the first, and the second print heads configured to convey a substrate to each of the first, and second print heads; and a computer aided manufacturing ("CAM") module, comprising: a data processor; a non-volatile memory; and a set of executable instructions stored thereon for: receiving a visualization file of the printed circuit board having an electromagnetically-shielded track; generating a file that represents at least one, substantially 2D layer for printing the printed circuit board having an electromagnetically-shielded track; receiving a selection of parameters related to the printed circuit board having an electromagnetically-shielded track; and altering the file represents at least one, substantially 2D layer based on at least one of the selection of parameters, wherein the CAM module is configured to control each of the first, and second print heads; providing the insulating resin inkjet ink composition, the first metallic inkjet ink composition and the support inkjet ink composition; using the CAM module, obtaining a plurality of generated files, each representing a substantially 2D layer of the printed circuit board having an electromagnetically-shielded track for printing, each the 2D layer comprising a pattern representative of the insulating resin inkjet ink, the first metallic inkjet ink and the support inkjet ink; and using the first inkjet print head, and the second print head, forming printed circuit board having an electromagnetically-shielded track wherein the insulating resin ink forms a sleeve around a conducting track and wherein the first metallic ink forms a shielding sleeve around the insulating resin sleeve.

In another embodiment, provided herein is a method for fabricating a printed circuit board having an electromagnetically-shielded component therein using inkjet printer comprising: providing an ink jet printing system comprising: a first print head having: at least one aperture, an insulating resin ink reservoir, and an insulating resin pump configured to supply the insulating resin inkjet ink through the aperture; a second print head having: at least one aperture, a first metallic ink reservoir, and a first metallic ink pump configured to supply the first metallic inkjet ink through the aperture; a conveyor, operably coupled to the first, and the second print heads configured to convey a substrate to each of the first, and second print heads; and a computer aided manufacturing ("CAM") module, comprising: a data processor; a non-volatile memory; and a set of executable instructions stored thereon for: receiving a visualization file of the printed circuit board having an electromagnetically-shielded track; generating a file that represents at least one, substantially 2D layer for printing the printed circuit board having an electromagnetically-shielded component; receiving a selection of parameters related to the printed circuit board having an electromagnetically-shielded component; and altering the file represents at least one, substantially 2D layer based on at least one of the selection of parameters, wherein the CAM module is configured to control each of the first, and second print heads; providing the insulating resin inkjet ink composition, the first metallic inkjet ink composition and the support inkjet ink composition; using the CAM module, obtaining a plurality of generated files, each representing a substantially 2D layer of the printed circuit board having an electromagnetically-shielded track for printing, each the 2D layer comprising a pattern representative of the insulating resin inkjet ink, the first metallic inkjet ink and the support inkjet ink; and using the first inkjet print head, and the second print head, forming printed circuit board having an electromagnetically-shielded component wherein the insulating resin ink forms a housing around a conducting track and wherein the first metallic ink forms a shielding capsule around the insulating resin housing.

In an embodiment, the metallic ink can be a dispersion of metallic nanoparticles in solvent or a metallic precursor solution or dispersion or a combination thereof.

In yet another embodiment, the inkjet printing system further comprises yet an additional print head having: at least one aperture, a support ink reservoir, and a support ink pump configured to supply the support ink through the aperture, the method further comprising: providing a support ink composition; before, subsequent or simultaneously to the step of using the first print head, using the support ink print head, forming a predetermined pattern corresponding to the support representation in the first, substantially 2D layer of the composite component for printing; and curing the predetermined pattern corresponding to the support representation in the 2D layer of the composite component.

These and other features of the methods and compositions for the direct and continuous 3D printing of insulation-jacketed tracks and/or components with metallic shielding sleeves or capsules, will become apparent from the following detailed description when read in conjunction with the figures and examples, which are exemplary, not limiting.

BRIEF DESCRIPTION OF THE FIGURES

For a better understanding of the methods and compositions for direct 3D printing of circuit boards having an electromagnetically-shielded tracks (interchangeable with traces) and/or components, with regard to the embodiments thereof, reference is made to the accompanying examples and figures, in which.

DETAILED DESCRIPTION

Figure 1:
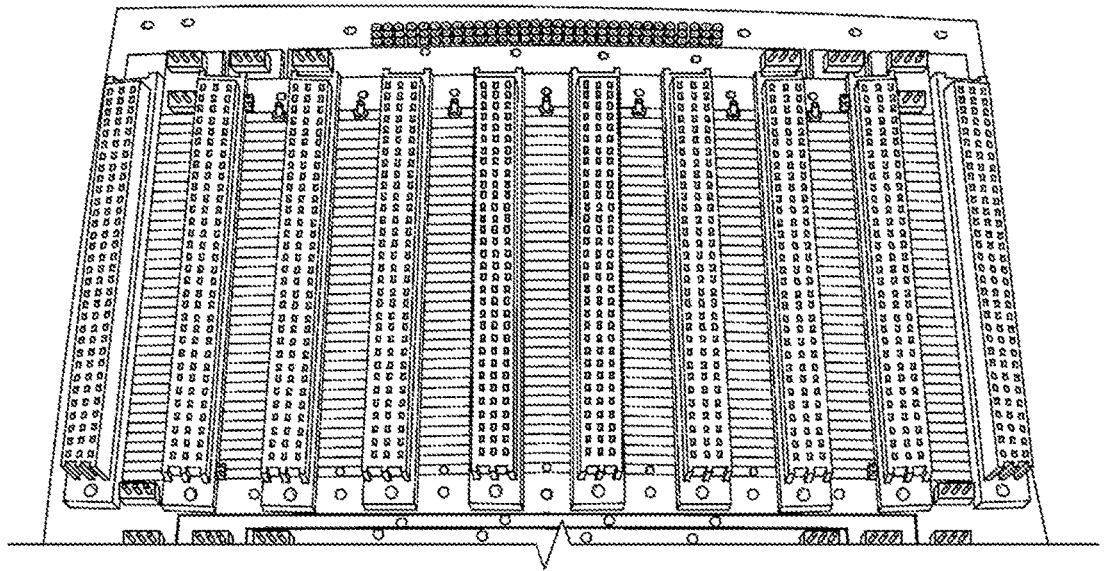
FIG. 1, illustrates an example of a typical printed circuit board backplane with connector array thereon.
Figure 2:
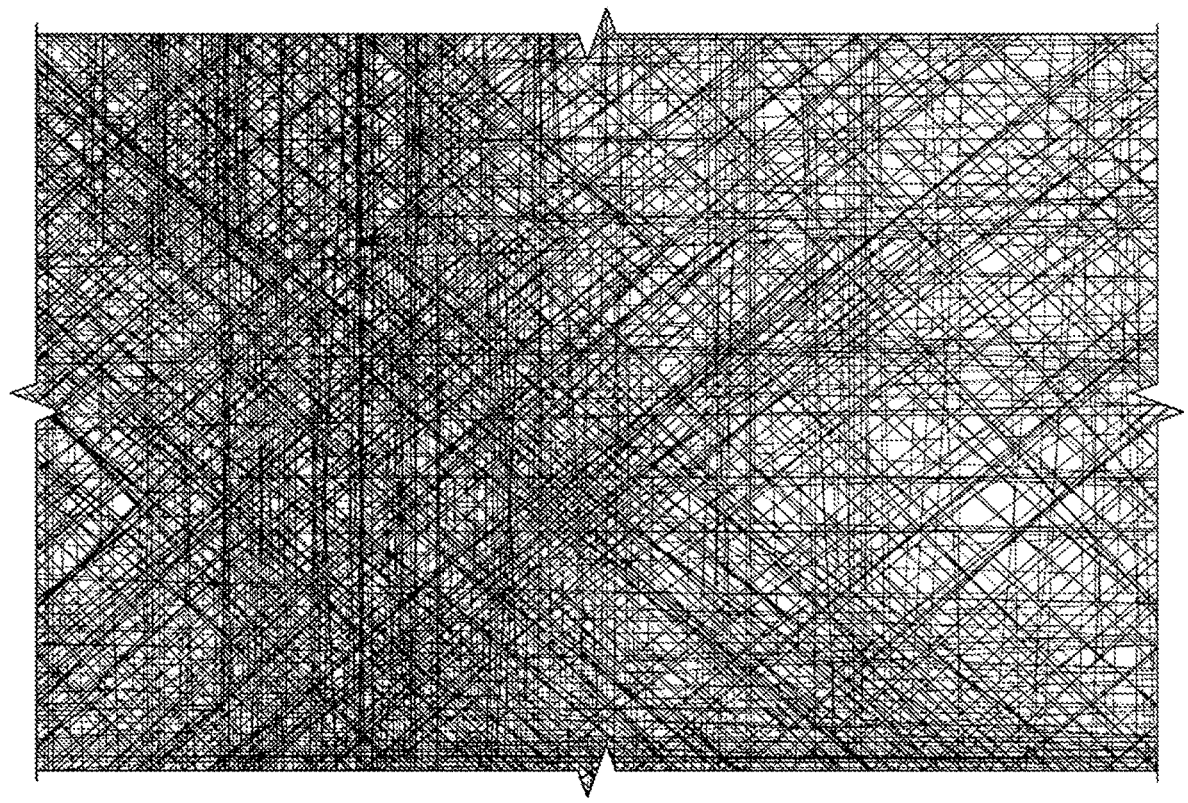
FIG. 2, illustrates a Y-Z cross section of a high trace density PCB, showing the traces in the stack.
Figure 3:
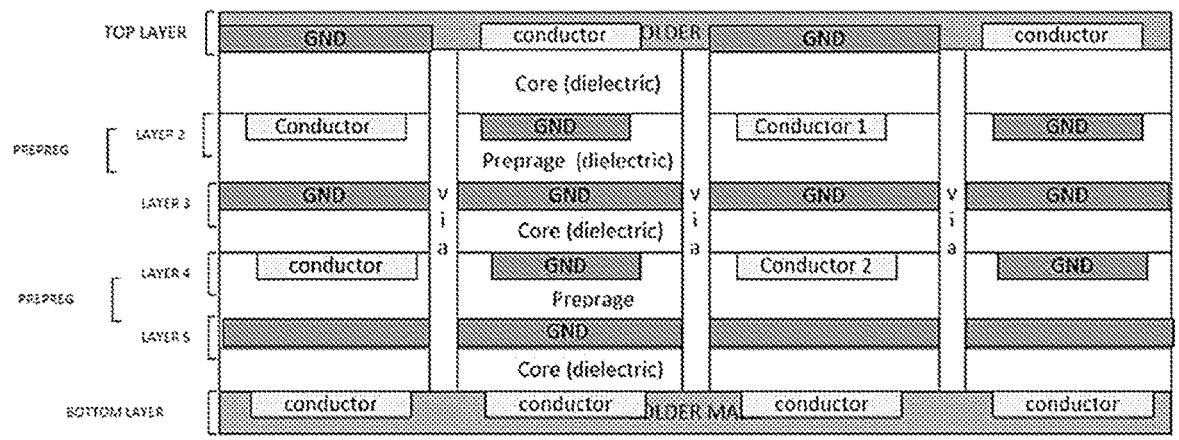
FIG. 3, illustrates a Y-Z cross section of the prior art attempts at mitigating traces and components cross EM talk.
Figure 4:
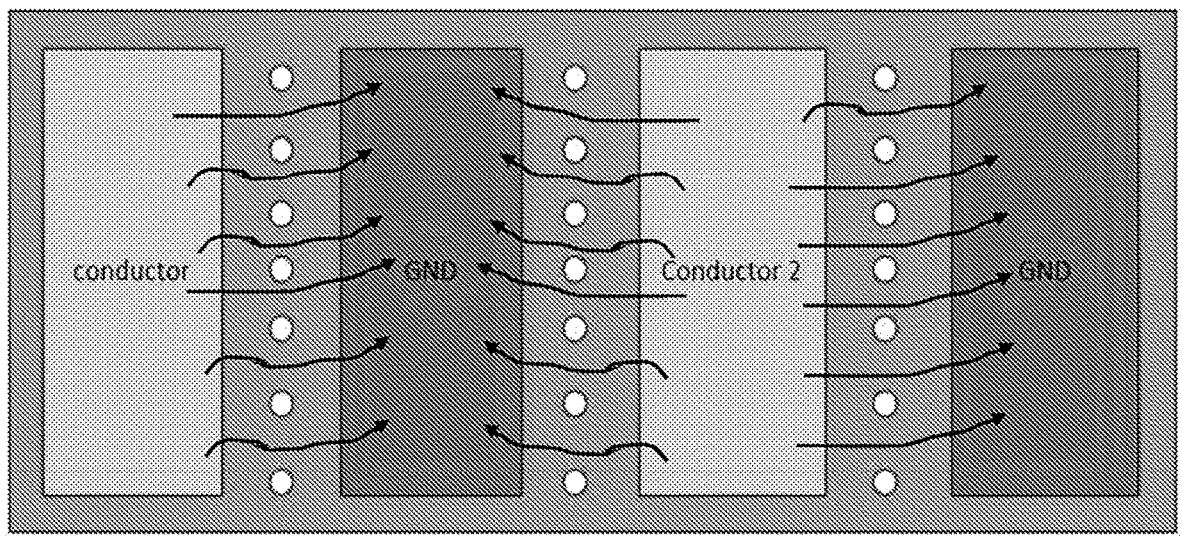
FIG. 4, illustrates a X-Y cross section of the prior art attempts at mitigating traces and components cross EM talk showing EM leaks among various conductive components and ground planes.

Provided herein are embodiments of methods, compositions and kits for direct, uninterrupted and continuous 3D printing of insulation-jacketed tracks and/or components with metallic shielding sleeves or capsule.

The methods described herein can be used to form the shielded traces and/or components in a continuous additive manufacturing process using the inkjet printing device, or using several passes. Using the methods described herein, a thermoset resin material can be used to form the insulating portion (e.g., jacket of the trace, or housing over the component) and be sleeved or further encapsulated or encased in metal, acting as shielding to the traces and/or components.

Using the methods, systems and compositions described herein, issues associated with crosstalk, such as signal integrity can be resolved. In digital electronics, a stream of binary values can be represented by a voltage or current waveform. Over short distances and at low bit rates, a simple conductor can transmit this with sufficient fidelity. However, at high bit rates and over longer distances, various effects, such as crosstalk can degrade the electrical signal to the point where errors occur, and the system or device fails.

Accordingly and in an embodiment, using the methods for direct printing of circuit boards (PCB) having an electromagnetically-shielded tracks and/or components; physical distance between the components during placement can be minimized or substantially reduced; parallel routed traces length can be maximized or substantially extended; logic component families can be grouped according to optimized location; components can be positioned closer to I/O interconnects and coupling thus reducing sizes of PCBs; traces can be routed parallel to each other at much closer distance;

adjacent layers can be stacked with thinner "prepreg" (refers to a "pre-impregnated" composite fiber layer); trace (track) impedance and signal drive level can be increased; signal to ground reference distance separation can be increased; shielded high noise emitters can be positioned in the same stack layer assignments potentially removing the need for ground connectors/planes; and/or remove the need for termination on impedance-controlled traces, or traces rich in RF harmonic energy; or a combination thereof, which may allow higher data transmission rates yet, or higher density of traces and or components. Accordingly and in an embodiment, provided herein are methods for affecting the aforementioned consequences of the shielding described and claimed herein.

Accordingly and in an embodiment, provided herein is a method for fabricating a printed circuit board having an electromagnetically-shielded track using inkjet printer comprising: providing an ink jet printing system comprising: a first print head having: at least one aperture, an insulating resin ink reservoir, and an insulating resin pump configured to supply the insulating resin inkjet ink through the aperture; a second print head having: at least one aperture, a first metallic ink reservoir, and a first metallic ink pump configured to supply the first metallic inkjet ink through the aperture; a conveyor, operably coupled to the first, and the second print heads configured to convey a substrate to each of the first, and second print heads; and a computer aided manufacturing ("CAM") module, comprising: a data processor; a non-volatile memory; and a set of executable instructions stored thereon for: receiving a visualization file of the printed circuit board having an electromagnetically-shielded track; generating a file that represents at least one, substantially 2D layer for printing the printed circuit board having an electromagnetically-shielded track; receiving a selection of parameters related to the printed circuit board having an electromagnetically-shielded track; and altering the file represents at least one, substantially 2D layer based on at least one of the selection of parameters, wherein the CAM module is configured to control each of the first, and second print heads; providing the insulating resin inkjet ink composition, the first metallic inkjet ink composition and the support inkjet ink composition; using the CAM module, obtaining a plurality of generated files, each representing a substantially 2D layer of the printed circuit board having an electromagnetically-shielded track for printing, each the 2D layer comprising a pattern representative of the insulating resin inkjet ink, the first metallic inkjet ink and the support inkjet ink; and using the first inkjet print head, and the second print head, forming printed circuit board having an electromagnetically-shielded track wherein the insulating resin ink forms a sleeve around a conducting track and wherein the first metallic ink forms a shielding sleeve around the insulating resin sleeve.

Also, in another embodiment, provided herein is a method for fabricating a printed circuit board having an electromagnetically-shielded component therein using inkjet printer comprising: providing an ink jet printing system comprising: a first print head having: at least one aperture, an insulating resin ink reservoir, and an insulating resin pump configured to supply the insulating resin inkjet ink through the aperture; a second print head having: at least one aperture, a first metallic ink reservoir, and a first metallic ink pump configured to supply the first metallic inkjet ink through the aperture; a conveyor, operably coupled to the first, and the second print heads configured to convey a substrate to each of the first, and second print heads; and a computer aided manufacturing ("CAM") module, comprising: a data processor; a non-volatile memory; and a set of executable instructions stored thereon for: receiving a visualization file of the printed circuit board having an electromagnetically-shielded track; generating a file that represents at least one, substantially 2D layer for printing the printed circuit board having an electromagnetically-shielded component; receiving a selection of parameters related to the printed circuit board having an electromagnetically-shielded component; and altering the file represents at least one, substantially 2D layer based on at least one of the selection of parameters, wherein the CAM module is configured to control each of the first, and second print heads; providing the insulating resin inkjet ink composition, the first metallic inkjet ink composition and the support inkjet ink composition; using the CAM module, obtaining a plurality of generated files, each representing a substantially 2D layer of the printed circuit board having an electromagnetically-shielded track for printing, each the 2D layer comprising a pattern representative of the insulating resin inkjet ink, the first metallic inkjet ink and the support inkjet ink; and using the first inkjet print head, and the second print head, forming printed circuit board having an electromagnetically-shielded component wherein the insulating resin ink forms a housing around a conducting track and wherein the first metallic ink forms a shielding capsule around the insulating resin housing. In an embodiment, the term "capsule" refers to any three dimensional object having a shell with an identifiable inner wall that substantially encloses an interior region.

As used herein, the term electromagnetic interference (EMI) should be considered to generally include and refer to both electromagnetic interference (EMI) and radio frequency interference (RFI) emissions, and the term "electromagnetic" should be considered to generally include and refer to both electromagnetic and radio frequency from external sources and internal sources. Accordingly, the term "shielding" (as used herein) generally includes and refers to both EMI shielding and RFI shielding, for example, to prevent (or at least reduce) ingress and egress of EMI and RFI relative to a trace or other enclosure in the PCB's comprising an electromagnetically-shielded tracks and/or components described herein.

Furthermore, the methods of forming the PCBs and/or FPCs with shielded traces and/or components described herein can further comprise a step of providing a peelable, or removable substrate, prior to the step of using the first print head, and/or the second print head. The term "peelable" refers in an embodiment to materials that can be removably applied to and adhere to surfaces such as the surface created by the method, compositions and kits for forming PCBs and/or FPCs with shielded traces and/or components described herein and can be subsequently removed from that surface by force. Peelable films according to the compositions and methods of this invention can be adhesively and removably applied to a chuck disposed on the printer's conveyor belt and, by virtue of being forcibly removed, expose a layer of the colored resin-metal composite components.

The removable substrate can also be a powder, for example, a ceramic powder, which can be applied to the chuck, compacted and later removed. The choice of substrate can depend, for example on the final composite components' use and structure. Furthermore, the removal of the substrate can take place at the end of the fabrication of the whole component, the fabrication of the first 2D layer, or at any stage in between.

The methods and compositions for direct printing of circuit boards (PCB) having an electromagnetically-shielded tracks and/or components can, as described above, comprise the step of providing a substrate (e.g., a peelable film). The print head (and derivatives thereof; are to be understood to refer to any device or technique that deposits, transfers or creates material on a surface in a controlled manner) depositing the insulating resin and/or metallic ink can be configured to provide the ink droplet(s) upon demand, in other words, as a function of various preselected process parameters such as conveyor speed, desired metallic layer thickness, layer type (e.g., trace, ground, sleeve), and the like. The removable or peelable substrate can also be a relatively rigid material, for example, glass or crystal (e.g., sapphire). Additionally, or alternatively, the peelable substrate may be a flexible (e.g., rollable) substrate (or film) to allow for an easy peeling of the substrate from the PCB's comprising an electromagnetically-shielded tracks and/or components, for example, poly (ethylenenaphthalate) (PEN), polyimide (e.g. KAPTONE® by DuPont), silicon polymers, poly(ethyleneterphtalate) (PET), poly(tetrafluoroethylene) (PTFE) films etc. Moreover, the substrate can be, for example a ceramic powder.

In an embodiment, the methods for fabricating or forming the PCB having an electromagnetically-shielded tracks and/or components can be further "built" by using the CAM module, obtaining a generated file representing a first, substantially 2D layer of the printed circuit board, the 2D layer comprising a pattern representative of the insulating resin inkjet ink, and representative of the first metallic inkjet ink. In other words the 2D file can be configured to show a bitmap of the X-Y cross section of the stack layer where the shielding metal is embedded within the insulating resin, whether outside the shielded trace (track) or component, or, in another embodiment, wherein the shielding metal is sandwiched between the insulating resin outside the shielded trace and/or component and the trace or component itself. Therefor the first print head can be used; forming the pattern corresponding to the insulating resin representation in the first, substantially 2D layer; curing the pattern corresponding to the insulating resin representation in the 2D layer of the printed circuit board; and either before, simultaneously with or subsequently; using the second print head, forming the pattern corresponding to the shielding metal sleeve representation in the first, substantially 2D layer of the printed circuit board having an electromagnetically-shielded track for printing; and sintering the pattern corresponding to the shielding metal sleeve representation in the 2D layer of the printed circuit board having an electromagnetically-shielded track. It should be noted, that in certain embodiments, sintering and curing can take place in no specific order and sometimes will take place simultaneously using, for example pulsed light at various wavelengths. In other words, using the methods described herein, the PCB designer can "build" the length of the trace and/or the capsule for a component, thereby shielding the trace throughout its length. Then; sintering the pattern corresponding to the shielding metal sleeve representation (or the encapsulating component "can" or capsule") in the 2D layer of the printed circuit board having an electromagnetically-shielded track and/or component.

The building of the PCB's comprising an electromagnetically-shielded tracks and/or components can proceed further, whereby using the CAM module, a generated file (e.g., bitmap) representing a substantially 2D layer of the printed circuit board having an electromagnetically-shielded track and/or component for printing subsequent 2D layer to the first layer, the subsequent 2D layer comprising a pattern representative of the insulating resin, and the shielding metal; using the first print head, forming the pattern corresponding to the insulating resin representation of the insulating ink in the subsequent, substantially 2D layer of the printed circuit board. In other words, using the insulating resin the system accretively prints the insulating jacket or housing around, or along the intended trace or component; curing the pattern corresponding to the insulating resin representation in the subsequent 2D layer (before during or after the printing of any metallica layer); using the second print head, forming the pattern corresponding to the shielding metal representation in the subsequent, substantially 2D layer of the printed circuit board; and sintering the pattern corresponding to the shielding metal representation in the subsequent 2D layer of the printed circuit board.

As described, using the additive manufacturing method and systems described herein, the building of the PCB's comprising an electromagnetically-shielded tracks and/or components can further comprise using the CAM module, obtaining a generated file representing a substantially 2D layer of the printed circuit board having an electromagnetically-shielded track for printing subsequent to the preceding layer, the subsequent 2D layer comprising a pattern representative of the conducting track, the insulating sleeve, and the shielding sleeve and the support inkjet ink; using the second print head, forming the pattern corresponding to the conducting track representation in the subsequent 2D layer of the printed circuit board; sintering the pattern corresponding to the conducting track (or trace) representation in the subsequent to the substantially 2D layer of the printed circuit board in the preceding layer; using the first print head, forming the pattern corresponding to the insulating resin representation of the insulating sleeve in the subsequent to the preceding substantially 2D layer; curing the pattern corresponding to the insulating resin representation in the 2D layer of the printed circuit board having an electromagnetically-shielded track; using the second print head, forming the pattern corresponding to the shielding metal representation in the subsequent to the substantially 2D layer of the printed circuit board in the preceding layer; and sintering the pattern corresponding to the shielding sleeve representation in the 2D layer of the printed circuit board having an electromagnetically-shielded track.

The build step can then proceed to completion by in an embodiment, by further using the CAM module, obtaining a generated file representing a substantially 2D layer of the printed circuit board having an electromagnetically-shielded track for printing subsequent to the layer of claim 5, the subsequent 2D layer comprising a pattern representative of the insulating sleeve, and the shielding sleeve; using the first print head, forming the pattern corresponding to the insulating resin representation of the insulating sleeve in the subsequent, substantially 2D layer of the printed circuit board having an electromagnetically-shielded track for printing; curing the pattern corresponding to the insulating resin representation in the 2D layer of the printed circuit board having an electromagnetically-shielded track; using the second print head, forming the pattern corresponding to the shielding metal representation in the subsequent to the first, substantially 2D layer of the printed circuit board having an electromagnetically-shielded track for printing; and sintering the pattern corresponding to the shielding sleeve representation in the 2D layer of the printed circuit board having an electromagnetically-shielded track.

In fabricating or forming the PCB's comprising an electromagnetically-shielded tracks and/or components described herein, by depositing substantially 2D layers of an insulating resin and/or metal materials, supporting layers or structures can be deposited as part of the substantial 2D representation of the PCB's comprising an electromagnetically-shielded tracks and/or components described herein. This support can be removable and be positioned underneath subsequently printed overhanging portions or in prospective cavities, which are not supported by the part or component material itself. A support structure may be built utilizing the same deposition techniques by which the conductive metallic trace or insulating resin portion are deposited. In an embodiment, the CAM module can generate additional geometry acting as a support structure for the overhanging or free-space segments of the 3D visualization file representing the PCB's comprising an electromagnetically-shielded tracks and/or components being formed, and in other circumstances, for the vias, ground planes or both being formed. The support material can be configured to, for example, adhere to the metal-shielded component housing during fabrication, and be removable from the completed PCB's comprising an electromagnetically-shielded tracks and/or components described herein when the printing process is completed.

The term "support" as used herein refers to one or more layers of a support material used to provide structural support to the plurality of layers of built colored resin and/or metal materials, during the fabrication of the colored resin-metal composite articles and components described herein. For example, the support material can be a wax including at least one functional group capable of reacting with the resin ink material, when exposed to the actinic radiation used for curing of the resin ink material. In some embodiments, the functional group in the wax is capable of reacting with the build material in the presence of a photoinitiator typically used for curing of the build material, and subsequent formation of the 3D article and later melted under mild heating and removed. Additional support materials can be, for example, non cross-linked, solvent/water soluble material, which allows support structures to be relatively easily washed away—once the print process is complete. Alternatively or additionally, breakaway support materials can also be possible, which can be removed by manually snapping them off the part.

In other embodiments, the support material used in the methods and systems for fabricating colored resin-metal composite articles and components described herein can be transparent to actinic radiation to accommodate "backflash" exposure through the support. In an embodiment, "actinic radiation" refers to an energy beam capable of curing a resin ink composition for stereolithography such as ultraviolet ray, electron beam, X-ray or radial ray. Accordingly, the term "actinic radiation-curable resin composition" to be used in producing the colored resin-metal composite articles and components described herein, can be a resin composition which is cured upon irradiation with one or more actinic radiations (energy beams) as described above.

Such a back exposure results in curing at least a part of the photopolymerizable resin ink composition in the layers nearest to the support. Examples of suitable support materials include polymeric films such as those formed by addition polymers and linear condensation polymers and transparent foams. Polymeric supports for use in the methods described herein, can be cellulose acetate propionate, cellulose acetate butyrate, polyesters such as polyethylene terephthalate (PET) and polyethylene naphthalate (PEN); oriented polystyrene (OPS); oriented nylon (ONy); polypropylene (PP); oriented polypropylene (OPP); polyvinyl chloride (PVC); and various polyamides, polycarbonates, polyimides, polyolefins, poly(vinylacetals), polyethers and polysulfonamides, and opaque white polyesters. Acrylic resins, phenol resins, glass and metals may also be used as an ink-receiver.

Depending on the material used in the support, using an aqueous dispersion on top of a water/solvent-soluble polymer film forming the support surface may not be feasible. In those circumstances, deposition of a resin material in a non-polar solvent can be performed, for example Poly(4-vinylphenol) dissolved in 1-methyl-2-pyrrolidin). Alternatively, Poly(vinyl fluoride) (PVF, PVDF) and/or polyamides could also possibly have the potential to serve as an inkjet printable resin ink. Additionally or alternatively, ceramic particles can be suspended in a soluble polymer solution and be configured to form a rigid support upon functionalizing of the support using, for example various curing techniques described herein and others. The rigid ceramic-in-polymer support can later be similarly removed by solubilizing the polymer. Ceramic powder, can be used in itself as the support under certain embodiments as well, either as a aqueous suspension, with an organic solvent or on its own.

Accordingly and in an embodiment, the inkjet printing system used in the methods and systems for fabricating the PCB's comprising an electromagnetically-shielded tracks and/or components, can further comprise yet an additional functional print head having: at least one aperture, a support ink reservoir, and a support ink pump configured to supply the support ink through the aperture. Using the additional support ink head, the method can further comprise providing a support ink composition; either subsequent, sequentially or simultaneously to the step of using the first print head, the second print head, or any other functional print head (and any permutation thereof), using the support ink print head, forming a predetermined pattern corresponding to the support representation generated by the CAM module from the 3D visualization file and represented as a pattern in the first, substantially 2D layer (or any subsequent layer) of the composite component for printing. The predetermined pattern corresponding to the support representation can then be further treated (e.g., cured, cooled, crosslinked and the like), to functionalize the pattern as support as described hereinabove in the 2D layer of the composite component. The process of depositing the support can be repeated thereafter for every sequential layer as needed.

The term "forming" (and its variants "formed", etc.) refers in an embodiment to pumping, injecting, pouring, releasing, displacing, spotting, circulating, or otherwise placing a fluid or material (e.g., the metallic ink) in contact with another material (e.g., the substrate, the resin or another layer) using any suitable manner known in the art.

Likewise, other functional heads may be located before, between or after the resin print head and/or the metallic (metal containing) print head These may include a source of electromagnetic radiation configured to emit electromagnetic radiation at a predetermined wavelength ($\lambda$), for example, between 190 nm and about 1100 nm, e.g. 365 nm which in an embodiment, can be used to accelerate and/or modulate and/or facilitate a photopolymerizable resin or facilitate sintering of metallic inks comprising metallic nanoparticles that can be used on conjunction with metal nanoparticles dispersion used in the metallic ink. Other functional heads can be heating elements, additional printing heads with various inks (e.g., pre-soldering connective ink, label printing of various components for example capacitors, transistors and the like) and a combination of the foregoing.

As indicated, the systems used to implement the methods for fabricating PCB's comprising an electromagnetically-shielded tracks and/or components, can have additional metallic ink print heads, which may contain different metals. For example, the second print head as described herein can comprise a Silver (Ag) nanoparticles while an additional print head for metallic ink may comprise different metal, e.g., Copper or Gold. Likewise, other metals (e.g., Al) or metal precursors can also be used and the examples provided should not be considered as limiting. Accordingly, the inkjet printing system further comprises yet an additional print head having: at least one aperture, a second metallic ink reservoir, and a second metallic ink pump configured to supply the second metallic ink through the aperture. Consequently, the methods can further comprise providing a second metallic ink composition; using the second metallic ink print head, forming a predetermined pattern corresponding to the second metal representation in the first, substantially 2D layer of the PCB's comprising an electromagnetically-shielded tracks and/or components for printing; and sintering the predetermined pattern in the 2D layer. The second metallic ink composition can have a different metal than the metallic ink composition in the second print head, or in another embodiment; and in order to achieve higher throughput, the second metallic ink composition can be identical in all metallic print heads. In an embodiment, the first metallic ink print head can be used to form the shielding and/or capsule and the second metallic ink print head can be used to print the trace.

In addition, all printing heads and the method of forming the PCB's comprising an electromagnetically-shielded tracks and/or component(s), can be configured to take place in a housing having controlled atmosphere therein. Likewise, controlled atmosphere can be affected by the resin ink formulation itself.

Other similar functional steps (and therefore means for affecting these steps) may be taken before or after each of the resin ink or metallic ink print heads (e.g., for sintering the metallic layer). These steps may include (but not limited to): a heating step (affected by a heating element, or hot air); photobleaching (of a photoresist mask support pattern), photocuring, or exposure to any other appropriate actinic radiation source (using e.g., a UV light source); drying (e.g., using vacuum region, or heating element); (reactive) plasma deposition (e.g., using pressurized plasma gun and a plasma beam controller); cross linking such as {4-[(2-hydroxytetradecyl)-oxyl]-phenyl}-phenyliodonium hexafluoro antimonate to a resin polymer solutions prior to coating or used as dispersant with the metal precursor or nanoparticles); annealing, or facilitating redox reactions. In certain embodiment, a laser (for example, selective laser sintering/melting, direct laser sintering/melting), or electron-beam melting can be used on either the resin or the metallic portion. It should be noted, that sintering of the metallic portions can take place even under circumstances whereby the metallic portions are printed on top of a resinous portion of the composite component.

It should be noted, that metallic layers can be embedded within the resin layers, separately and distinct from a coating pattern above the resin layer. For example, a metallic ground layer can be deposited over a support layer, which following removal, will be independent of any resin material.

Accordingly, in an embodiment, the steps of using the first print head and depositing the metallic inkjet ink onto the substrate, thereby forming a first printed metallic pattern layer and/or the step of depositing the insulating resin containing inkjet ink onto the removable substrate, and/or or removable support, is preceded, followed or takes place concurrently with a step of heating, photocuring drying, depositing plasma, cross linking, annealing, facilitating redox reactions, sintering, melting or a combination of steps comprising one or more of the foregoing. The pre-, or post portion treatment (in other words, functionalizing the resin and/or metallic and/or support portions) can take place either before or after the step of using the coloring print head(s), the additional resin ink print head(s), the additional metallic ink print head(s) or their permutations.

Formulating the metallic ink composition, may take into account the requirements, if any, imposed by the deposition tool (e.g., in terms of viscosity and surface tension of the composition) and the deposition surface characteristics (e.g., hydrophilic or hydrophobic, and the interfacial energy of the peelable or removable substrate or the support material used), whether the ink is used for shielding or conducting or both. Using ink-jet printing with a piezo head, the viscosity of either the metallic ink and/or the resin-forming inkjet ink (measured at 20° C.) can be, for example, not lower than about 5 cP, e.g., not lower than about 8 cP, or not lower than about 10 cP, and not higher than about 30 cP, e.g., not higher than about 20 cP, or not higher than about 15 cP. The metallic ink, can each be configured (e.g., formulated) to have a dynamic surface tension (referring to a surface tension when an ink-jet ink droplet is formed at the print-head aperture) of between about 25 mN/m and about 35 mN/m, for example between about 29 mN/m and about 31 mN/m measured by maximum bubble pressure tensiometry at a surface age of 50 ms and at 25° C. The dynamic surface tension can be formulated to provide a contact angle with the peelable substrate, the support material, the resin layer(s), or their combination, of between about 100° and about 165°.

Using a metallic composition in the methods of fabricating PCBs and/or FPCs with shielded traces and/or components as described herein, can be composed essentially of solvent-suspended metallic copper, silver, aluminum nanoparticles, or metallic inkjet ink compositions comprising one or more of the foregoing and other metals (e.g., Group IA (1) of the periodic table), a binder, and a solvent, wherein the diameter, shape and composition ratio of the nanoparticles in the ink are optimized, thus enabling the formation of a layer, or dense printed pattern. It should be noted that choice of metal ink will depend on the final characteristics of the 3D PCB's comprising an electromagnetically-shielded tracks and/or components sought to be printed. These particles can be in a size range suitable for the desired applications. In an embodiment, metallic portion patterns formed using silver are printed using inks of nanosilver suspensions. The metallic portion of the 2D representation of the PCB's comprising an electromagnetically-shielded tracks and/or components, can be significantly enhanced in quality during sintering by, for example, the silver nanoparticles having thin or small features with high aspect ratios. In other words, by having metallic nanoparticles with aspect ratio R is much higher than 1 (R>>1). Having the high aspect ratio can create an alignment of the nanoparticles due to, for example, flow orientation of the ink in the direction of motion of the substrate on a chuck, or in another embodiment, by the ejection process from the print head's orifice.

In an embodiment, the term "chuck" is intended to mean a mechanism for supporting, holding, or retaining a substrate or a workpiece. The chuck may include one or more pieces. In one embodiment, the chuck may include a combination of a stage and an insert, a platform, be jacketed or otherwise be configured for heating and/or cooling and have another similar component, or any combination thereof.

In an embodiment, the ink-jet ink compositions and methods allowing for a continuous or semi-continuous ink-jet printing of a PCB's comprising an electromagnetically-shielded tracks and/or components, can be patterned by expelling droplets of the liquid ink-jet ink provided herein from an orifice one-at-a-time, as the print-head (or the substrate) is maneuvered, for example in two (X-Y) (it should be understood that the print head can also move in the Z axis) dimensions at a predetermined distance above the removable substrate or any subsequent layer. The height of the print head can be changed with the number of layers, maintaining for example a fixed distance. Each droplet can be configured to take a predetermined trajectory to the substrate on command by, for example a pressure impulse, via a deformable piezo-crystal in an embodiment, from within a well operably coupled to the orifice. The printing of the first inkjet metallic ink can be additive and can accommodate a greater number of layers. The ink-jet print heads provided used in the methods described herein can provide a minimum layer film thickness equal to or less than about 3 µm-10,000 µm The conveyor maneuvering among the various print heads used in the methods described and implementable in the systems described can be configured to move at a velocity of between about 5 mm/sec and about 1000 mm/sec. The velocity of the e.g., chuck can depend, for example, on: the desired throughput, the number of print heads used in the process, the number and thickness of layers of the PCB's comprising an electromagnetically-shielded tracks and/or components, printed, the curing time of the ink, the evaporation rate of the ink solvents, the distance between the print head(s) containing the first ink-jet metallic ink of the metal particles or metallic polymer paste and the second print head comprising the second, thermoset insulating resin and board forming inkjet ink, and the like or a combination of factors comprising one or more of the foregoing.

In an embodiment, the dynamic viscosity of the metallic ink composition, and/or the second, resin ink, and/or the third, coloring ink can each be between about 0.1 and about 30 cP·s (mPa·s), for example the final ink formulation can have a viscosity of 8-12 cP·s at the working temperature, which can be controlled. For example, the metallic nanoparticles dispersion, solution, emulsion, suspension, or liquid composition comprising the foregoing, or the resin inkjet ink can each be between about 5 cP·s and about 25 cP·s, or between about 7 cP·s and about 20 cP·s, specifically, between about 8 cP·s and about 15 cP·s.

In an embodiment, the volume of each droplet of the metallic (or metallic) ink, and/or the second, resin ink, can range from 0.5 to 300 picoLiter (pL), for example 1-4 pL and depended on the strength of the driving pulse and the properties of the ink. The waveform to expel a single droplet can be a 10V to about 70 V pulse, or about 16V to about 20V, and can be expelled at frequencies between about 2 kHz and about 500 kHz.

The insulating resin ink can be configured to be stable within a print head reservoir. For example, the solid contents (i.e., suspended solids if colloidal suspension, or solute if a solution) can be between about 5 and about 100 wt %. Likewise, the suspended ink solids in other words, latex inks, can be uniformly dispersed in the solvent by additional suitable surfactant. Conversely, suitable surfactants may not be necessary and the ink can be 100% active, by incorporating photoactive monomers/oligomers and their combination, in which no appreciable sedimentation can take place. Further, the ink viscosity can be adjusted to facilitate ejection of droplets. Accordingly, in an embodiment, the surface energy ($\gamma$) together with dynamic viscosity ($\mu$) of the resin ink solutions used in the methods of forming the PCB's comprising an electromagnetically-shielded tracks and/or components described herein, can be in the range of between about 25 mN/m and about 35 mN/m and between about 8 mNs/m$^2$ (cP) and about 15 mNs/m$^2$ (cP), respectively. Inks used in certain embodiments, which are comprised of suspended sub-micron particles, for example in the pigment coloring inks and metallic particles inks, as well as, in some embodiments, the resin inks can be configured to facilitate optimal operation as determined by some thresholds (e.g., nozzle orifice and nozzle neck) inside micro liquid channels of the print head(s).

In an embodiment, the cross-linking agent, co-monomer, co-oligomer, co-polymer or a composition comprising one or more of the foregoing and is used in the insulating resin ink(s) provided, can be a part, or configured to form a solution, emulsion, or suspension within the resin ink compositions.

In an embodiment, the insulating ink used in the methods implementable in the systems described herein, can be a suspension composition comprising: a dispersed phase comprising a plurality of porous particulates impregnated with embedded monomer, oligomer, or a combination comprising the foregoing, wherein the monomer, oligomer or a combination thereof has a first terminal end coupled to the porous particulate and a second, functional terminal end, wherein the monomer, oligomer, polymer, or their combination that is operably coupled to the porous particulates are entirely embedded within the particulates and configured to leach out of the porous particulate at a temperature of between about 60° C. and about 150° C.; and a continuous phase comprising: multifunctional acrylate monomer, oligomer, polymer or their combination; a cross-linking agent; and a radical photoinitiator, wherein the monomer, oligomer, polymer or their combination impregnated in the porous particulates is partially soluble in the continuous phase and/or is thermodynamically incompatible with a material forming the particulates.

In an inactivated state, the monomer, oligomer, polymer, or their combination is entirely embedded within porous particulates and upon heating, or activation, the live monomer, live oligomer, live polymer or their combination partially leaches out of the porous particulates. Accordingly, the monomer, oligomer, polymer, or their combination is not coupled to the porous particulates by surface modification or surface functionalization of the porous particulates, but rather, through internal modification i.e., physical linkage, forming in an embodiment an integrated hybrid particle. Under these circumstances, it is possible to provide the suspension in combination with a curing agent, or a cross-linking agent, a live, or active co-monomer, co-oligomer, co-polymer or a composition comprising one or more of the foregoing, without thermosetting the mixture. Moreover, by embedding the monomer, oligomer, polymer, or their combination inside the porous particulate used for reinforcing the resin, the reinforcement particulates become integral to the resin polymer or co-polymer's backbone.

In addition, live, or active co-monomer, co-oligomer, co-polymer or a composition comprising one or more of the foregoing, can likewise be impregnated and embedded within a plurality of particulates, that can be the same or different as the particulates impregnated with the monomer, oligomer or polymer forming the resin's backbone. In other words, by entrapping, for example, the cross linking agent within particulates of the same or different material at predetermined concentrations that, depending on the resin-forming monomers, oligomers or polymers and their combination, both particles can be used in a single ink composition and only upon heating or exposure to a swelling agent, release the entrapped components for reacting and forming the resin. Final properties of the board, film, sheet or any other component or device formed accordingly can be tightly control by proper election of various factors, such as, for example:
a. type of monomer used (e.g., bisphenol-F);
b. average weight number MW of the resin-forming polymer/oligomer;
c. concentration within the primary particulate (W/W);
d. Primary particulates concentration (in other words, the particulates that, in an embodiment, are impregnated with the resin monomer (e.g., bisphenol-A)) in the ink (w/w)
e. Type of primary particulates (e.g., silica, mica etc.);
f. Primary particulates formation process (e.g., control pore size, etc);
g. type of cross-linking agent used (e.g., diethylene triamine);
h. average weight number MW of the cross-linking polymer/oligomer;
i. concentration of cross-linking agent within the secondary particulate (W/W);
j. Secondary particulates concentration (in other words, the particulates that, in an embodiment, are impregnated with the cross-linking agent (e.g., triethylene tetraamine)) in the ink (w/w);
k. Type of secondary particulates (e.g., silica, mica etc.);
l. Secondary particulates formation process (e.g., annealing to reduce Vf, etc), or a combination of factors comprising one or more of the foregoing Initiating the resin backbone can be done using an initiator, for example benzoyl peroxide (BP) and other peroxide-containing compounds. The term "initiator" as used herein generally refers to a substance that initiates a chemical reaction, specifically any compound which initiates polymerization, or produces a reactive species which initiates polymerization, including, for example and without limitation, co-initiators and/or photoinitiator(s).

The terms "live monomer", "live oligomer", "live polymer" or their counterparts (co-monomer e.g.,) combination refers in an embodiment to a monomer, a short group of monomers or a polymer having at least one functional group capable of forming a radical reaction (in other words, the reaction can be continued and is not otherwise terminated by an end-group) Likewise, the term "embedded", as used for example in connection with the monomer, oligomer, polymer, or their combination being embedded within the mesoporous particulates, is intended to mean that the embedded material is dispersed within the particulate of the mesoporous particulates as may be accomplished, for example, by blending the monomer, oligomer, polymer, or their combination with the materials used to prepare the, for example mesoporous particulate before it is formed into an particulate, e.g., a bead. For example, the live monomer, live oligomer, live polymer or their combination can be combined under certain circumstances with tetraethoxysilane (TEOS) to form mesoporous particle with the live monomer, live oligomer, polymer or their combination, entrapped within the particulate matter. The term "embedded" excludes live monomer, live oligomer, polymer or their combination applied (as in functionalized) to the surface of a preformed particulate of microporous material, or live monomer, live oligomer, or their combination material that has been applied to the surface of a preformed particulate of microporous material and allowed to be adsorbed to an area just below the surface of a preformed particulate of microporous material, as for example by applying ink to the surface of the preformed matrix (dipping). (According to the IUPAC definition, "micropores" are of a diameter <2 nm, "mesopores" have a diameter within the interval of 2-50 nm and "micropores" are of a diameter >50 nm.). Also, in an embodiment, the term "entrapped" refers to the retention for a period of time of the live monomer, live oligomer, live polymer or their combination in the interstitial free volume ($V_f$) of the silica.

Activation of the live monomer, live oligomer, live polymer or their combination, and thus allowing contact between the live monomer, live oligomer, or their combination and, for example, a cross-linking agent to initiate curing, can be caused by increase in the interstitial free volume ($V_f$) of the particulates, resulting from the heating either alone, or in the presence of a swelling agent present in the aqueous phase of the composition. The mechanism may be (without limitation) such that the heat increases the viscosity of the polymer encapsulated within the silica particles and their kinetic energy, once the $V_f$ is larger than the critical segment length of the polymer, oligomer or monomer or their combination, the polymer can begin to flow within the particulate which, in turn can cause the polymer chains to leach out.

Further, the term "impregnate" means for example, to fill throughout or to saturate the porous, or mesoporous particulates with the monomer, oligomer, polymer, or their combination. For example, the porous particulate is impregnated with the live monomer, live oligomer, or polymer or a combination thereof in a concentration of between about 5% and about 80% weight of the monomer, oligomer, polymer, or their combination per weight of the particulate (w/w).

The amount of live monomer, live oligomer, or their combination the porous particulates are impregnated with will change with the desired physic-chemical characteristic of the board, film or sheet sought to be formed. The live monomer, live oligomer or a combination thereof has a number average molecular weight ($\overline{MW}_n$), in other words the average number of monomers per chain of between 1 and about 2000, for example, $\overline{MW}_n$ between 1 and about 1000 or $\overline{MW}_n$ of between about 250 and about 750, specifically between about 300 and about 500.

In an embodiment, the cross-linking agent, co-monomer, co-oligomer, co-polymer or a composition comprising one or more of the foregoing and is used in the resin ink(s) provided, can be a part, or configured to form a solution, emulsion, or suspension within the resin ink compositions.

In another embodiment, the continuous phase comprises active components of a polymer capable of undergoing photoinitiation using a photoinitiator. Such live monomer, live oligomer, live polymer or their combination capable of undergoing photoinitiation can be for example, multifunctional acrylates, for example a multifunctional acrylate that can be multifunctional acrylate is selected from the group consisting of 1,2-ethanediol diacrylate, 1,3-propanediol diacrylate, 1,4-butanediol diacrylate, 1,6-hexanediol diacrylate, dipropylene glycol diacrylate, neopentyl glycol diacrylate, ethoxylated neopentyl glycol diacrylate, propoxylated neopentyl glycol diacrylate, tripropylene glycol diacrylate, bisphenol-A-diglycidyl ether diacrylate, hydroxypivalic acid neopentanediol diacrylate, ethoxylated bisphenol-A-diglycidyl ether diacrylate, polyethylene glycol diacrylate, trimethylolpropane triacrylate, ethoxylated trimethylolpropane triacrylate, propoxylated trimethylolpropane triacrylate, propoxylated glycerol triacrylate, tris(2-acryloyloxyethyl) isocyanurate, pentaerythritol triacrylate, ethoxylated pentaerythritol triacrylate, pentaerythritol tetraacrylate, ethoxylated pentaerythritol tetraacrylate, ditrimethylolpropane tetraacrylate, dipentaerythritol pentaacrylate and dipentaerythritol hexaacrylate.

Photoinitiators that can be used with the multifunctional acrylates described herein can be, for example radical photoinitiator. These radical photoinitiators can be, for example Irgacure® 500 from CIBA SPECIALTY CHEMICAL and Darocur® 1173, Irgacure® 819, Irgacure® 184, TPO-L (ethyl(2,4,6, trimethyl benzoil) phenyl phosphinate) benzophenone and acetophenone compounds and the like. For example, the radical photoinitiator can be cationic photoinitiator, such as mixed triarylsulfonium hexafluoroantimonate salts. Another example of the radical photoinitiator used in the active continuous phase described herein, can be 2-ispropylthioxanthone.

As described, the parameters used in the step of selection of parameters related to the composite component performed by the CAM module used for the fabrication of the colored resin-metal composite components, can be, for example: the desired printing throughput, the resin pattern in the layer, the metallic pattern in the layer, whether shielding or conducting, curing requirements for the resin and/or metallic pattern in the layer, the need and location of (removable) support layers, vias, ground planes or a combination of parameters comprising one or more of the foregoing.

The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple (remote) locations. Moreover, when appropriate, the term "module" is used herein to refer to software computer program code and/or any hardware or circuitry utilized to provide the functionality attributed to the module. Further, the term "module" or "component" can also refer to software objects or routines that execute on the computing system. The different components, modules, engines, and services described herein may be implemented as objects or processes that execute on the computing system (e.g., as separate threads).

The CAM module can comprise: a 2D file library storing the files converted from the 3D visualization files of the PCB's comprising an electromagnetically-shielded tracks and/or components; a processor in communication with the library; a memory device storing a set of operational instructions for execution by the processor; a micromechanical inkjet print head or heads in communication with the processor and with the library; and a print head (or, heads') interface circuit in communication with the 2D file library, the memory and the micromechanical inkjet print head or heads, the 2D file library configured to provide printer operation parameters specific to a functional layer (in other words, metallic (whether shielding, conducting or both), or insulating); pre-processing Computer-Aided Design/Computer-Aided Manufacturing (CAD/CAM) generated information associated with the 3D PCB's comprising an electromagnetically-shielded tracks and/or components sought to be fabricated, thereby obtaining a plurality of 2D file; loading the plurality of 2D file s processed in the step of pre-processing from the PCB's comprising an electromagnetically-shielded tracks and/or components 3D visualization files onto the 2D file library; and using the 2D file library, instructing the processor to print the predetermined layer of the PCB's comprising an electromagnetically-shielded tracks and/or components in the predetermined order.

The 3D visualization file representing the PCB's comprising an electromagnetically-shielded tracks and/or components used for the fabrication of the colored resin-metal composite components, can be: an .asm, an STL, an IGES, a STEP, a Catia, a SolidWorks, a ProE, a 3D Studio, a Gerber, a Rhino file or a file comprising one or more of the foregoing; and wherein file that represents at least one, substantially 2D layer (and uploaded to the library) can be, for example, a JPEG, a GIF, a TIFF, a BMP, a PDF file, or a combination comprising one or more of the foregoing.

In certain embodiments, the CAM module can further comprises a computer program product for fabricating one or more PCB's comprising an electromagnetically-shielded tracks and/or components (see e.g., FIGS. 5, 6) and the like. The PCB's comprising an electromagnetically-shielded tracks and/or components can be printed optionally simultaneously or sequentially and continuously. The term "continuous" and its variants are intended to mean printing in a substantially unbroken process. In another embodiment, continuous refers to a layer, member, or structure in which no significant breaks in the layer, member, or structure lie along its length. Furthermore, a job editor or, a Print Job Manager (PJM) can be incorporated into the CAM module. Via the job editor, print jobs (e.g., job tickets) can be generated whereby traces and/or components can be converted to shielded traces and or components and transmitted to CAM module.

In an embodiment the CAM module can comprise a computer at which a first computer program resides which provides substantially 2D layer generation unit or sub module for generating layer templates and a second computer program resides which provides print heads administration unit. The module can further comprise a storage within the computer. The module can further comprise a job editor module. The job editor can generates a plurality of Print head and printing jobs (e.g., "tickets" for printing dielectric, conductive inks, sintering, curing, advancing), based on the trace and/or component shielding requirements, and be configured for transferring the print command for the 2D layer to a print server, and convert otherwise unshielded traces and/or unshielded components, to a pattern representing shielded traces and components within the same layer.

Figure 5:
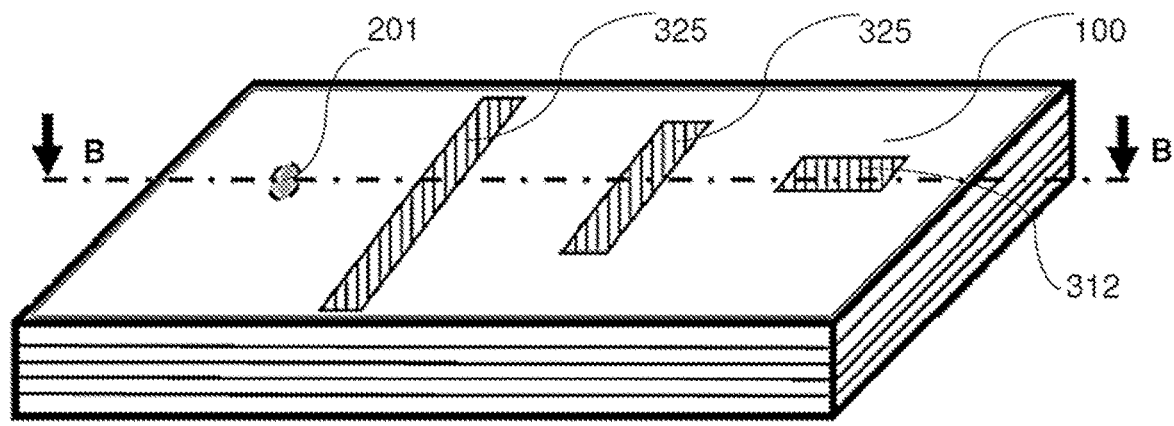
FIG. 5, illustrates top isometric view of a 3D PCB fabricated using the methods provided, resulting in insulation jacketed conductive components and traces.
Figure 6:
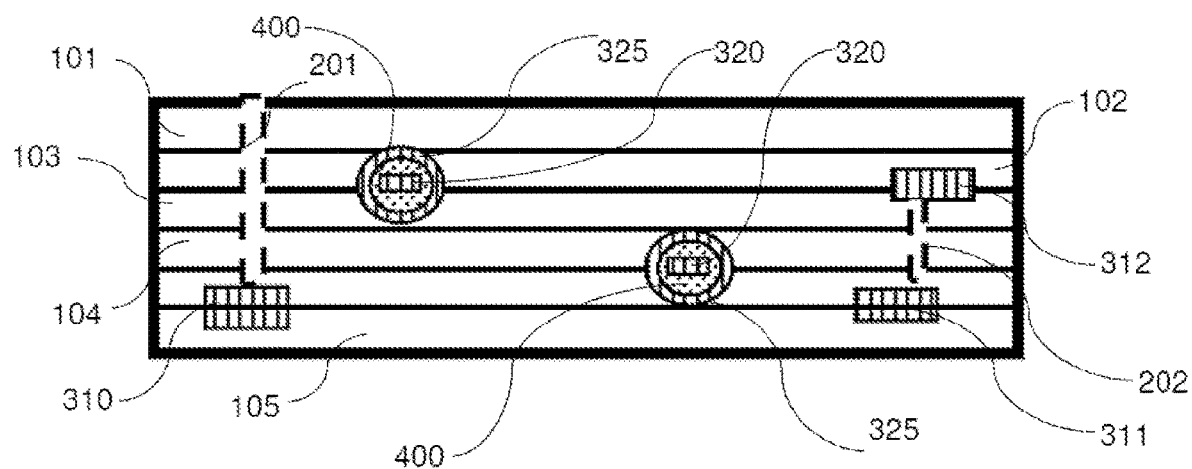
FIG. 6, illustrates Y-Z cross section B-B of FIG. 5.

For example, and as illustrated in FIGS. 5, 6, a PCB's comprising an electromagnetically-shielded tracks and/or components using the methods described. As illustrated PCB 10 can comprise top layer 100 with embedded shielding sleeves or capsules 325. as well as via 201 extending from PCB 10 top layer 100, and into shielded component 310 (see e.g., FIG. 6). Turning now to FIG. 6, illustrating shielded components 310, 311, and 312, and traces 320. As illustrated in FIG. 6, each trace 320 can have an insulating jacket 400 and a shielding sleeve 325. Likewise, components 310, 310 and 312 can each be housed in insulating resin housing 400 and shielding metal capsule 325. Note, components 311, and 312 can be connected by blind via 202 which can be likewise printed with conducting metallic walls.

The computer controlling the printing process described herein can comprise: a computer readable storage medium having computer readable program code embodied therewith, the computer readable program code when executed by a processor in a digital computing device causes a three-dimensional inkjet printing unit to perform the steps of: pre-processing Computer-Aided Design/Computer-Aided Manufacturing (CAD/CAM) generated information associated with the colored resin-metal composite component (in other words, the 3D visualization file representing the PCB's comprising an electromagnetically-shielded tracks and/or components) to be fabricated, thereby obtaining a plurality of 2D files (in other words, the file that represents at least one, substantially 2D layer for printing the PCB's comprising an electromagnetically-shielded tracks and/or components), each 2D file specific for a predetermined layer in a specific order; loading the plurality of 2D file s processed in the step of pre-processing onto a 2D file library; directing a stream of droplets of an insulating resin ink from a first inkjet print head of the three-dimensional inkjet printing unit at a surface of a substrate; directing a stream of droplets of a metallic inkjet ink from a second inkjet print head of the three-dimensional inkjet printing unit at the surface of the substrate; alternatively or additionally directing a stream of droplets of a supporting material from a third inkjet print head of the three-dimensional inkjet printing unit at a surface of the metallic pattern and/or the insulating resin pattern and/or a support portion pattern; optionally directing a stream of droplets of a support material from a fourth inkjet print head of the three-dimensional inkjet printing unit at a surface of the metallic pattern and/or the resin pattern; moving the first, second, optionally third, and optionally fourth inkjet heads relative to the substrate in an x-y plane of the substrate, wherein the step of moving the first, second, optionally third, and optionally fourth inkjet heads relative to the substrate in the x-y plane of the substrate, for each of a plurality of layers is performed in a layer-by-layer fabrication of the PCB's comprising an electromagnetically-shielded tracks and/or components on the substrate.

In addition, the computer program, can comprise program code means for carrying out the steps of the methods described herein, as well as a computer program product comprising program code means stored on a medium that can be read by a computer, such as a floppy disk, a hard disk, CD-ROM, DVD, USB memory stick, or a storage medium that can be accessed via a data network, such as the Internet or Intranet, when the computer program product is loaded in the main memory of a computer and is carried out by the computer.

Embodiments described herein may comprise or utilize a special purpose or general-purpose computer including computer hardware, such as, for example, one or more processors (e.g., central processing module, CPM) and system memory, as discussed in greater detail below. Embodiments described herein also include physical and other computer-readable media for carrying or storing computer-executable instructions and/or data structures. Such computer-readable media can be any available media that can be accessed by a general purpose or special purpose computer system. Computer-readable media that store computer-executable instructions are physical storage media. Computer-readable media that carry computer-executable instructions are transmission media. Thus, by way of example, and not limitation, embodiments of the disclosed technology, can comprise at least two distinctly different kinds of computer-readable media: computer storage media and transmission media.

Memory device(s) as used in the methods described herein can be any of various types of non-volatile memory devices or storage devices (in other words, memory devices that do not lose the information thereon in the absence of power). The term "memory device" is intended to encompass an installation medium, e.g., a CD-ROM, floppy disks, or tape device or a non-volatile memory such as a magnetic media, e.g., a hard drive, optical storage, or ROM, EPROM, FLASH, etc. The memory device may comprise other types of memory as well, or combinations thereof. In addition, the memory medium may be located in a first computer in which the programs are executed (e.g., the 3D inkjet printer provided), and/or may be located in a second different computer which connects to the first computer over a network, such as the Internet. In the latter instance, the second computer may further provide program instructions to the first computer for execution. The term "memory device" can also include two or more memory devices which may reside in different locations, e.g., in different computers that are connected over a network. Accordingly, for example, the bitmap library of the various layers of the PCB's comprising an electromagnetically-shielded tracks and/or components can reside on a memory device that is remote from the CAM module coupled to the 3D inkjet printer provided, and be accessible by the 3D inkjet printer provided (for example, by a wide area network).

Unless specifically stated otherwise, as apparent from the following discussions, it is appreciated that throughout the specification discussions utilizing terms such as "processing," "loading," "in communication," "detecting," "calculating," "determining", "analyzing," or the like, refer to the action and/or processes of a computer or computing system, or similar electronic computing device, that manipulate and/or transform data represented as physical, such as a transistor architecture into other data similarly represented as physical structural (in other words, insulating resin, metal/metallic, or support) layers.

Furthermore, as used herein, the term "2D file library" refers to a given set of files that together define a single PCB's comprising an electromagnetically-shielded tracks and/or components, or a plurality thereof used for a given purpose. The term can also be used to refer to a set of 2D files or any other raster graphic file format (the representation of images as a collection of pixels, generally in the form of a rectangular grid, e.g., BMP, PNG, TIFF, GIF), capable of being indexed, searched, and reassembled to provide the structural layers of a given PCB's comprising an electromagnetically-shielded tracks and/or components—whether the search is for the PCB, or a given specific layer (see e.g., 101-105, FIG. 6).

The Computer-Aided Design/Computer-Aided Manufacturing (CAD/CAM) generated information associated with the PCB's comprising an electromagnetically-shielded tracks and/or components to be fabricated used in the methods, programs and libraries for using inkjet printing based on converted CAD/CAM data packages can be, for example, IGES, DXF, DMIS, NC files, GERBER® files, EXCELLON®, STL, EPRT files, an .asm, a STEP, a Catia, a SolidWorks, a ProE, a 3D Studio, a Rhino file or a package comprising one or more of the foregoing. Additionally, attributes attached to the graphics objects transfer the meta-information needed for fabrication and can precisely define the PCB's comprising an electromagnetically-shielded tracks and/or components image and the structure and color of the image (e.g., resin, support or metal), resulting in an efficient and effective transfer of fabrication data from design (3D visualization CAD e.g.,) to fabrication (CAM e.g.,). Accordingly and in an embodiment, using pre-processing algorithm, GERBER®, EXCELLON®, DWG, DXF, STL, EPRT ASM, and the like as described herein, are converted to 2D files.

The term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives.

All ranges disclosed herein are inclusive of the endpoints, and the endpoints are independently combinable with each other. "Combination" is inclusive of blends, mixtures, alloys, reaction products, and the like. The terms "a", "an" and "the" herein do not denote a limitation of quantity, and are to be construed to cover both the singular and the plural, unless otherwise indicated herein or clearly contradicted by context. The suffix "(s)" as used herein is intended to include both the singular and the plural of the term that it modifies, thereby including one or more of that term (e.g., the layer(s) includes one or more layers).

Reference throughout the specification to "one embodiment", "another embodiment", "an embodiment", and so forth, when present, means that a particular element (e.g., feature, structure, and/or characteristic) described in connection with the embodiment is included in at least one embodiment described herein, and may or may not be present in other embodiments. In addition, it is to be understood that the described elements may be combined in any suitable manner in the various embodiments.

All ranges disclosed herein are inclusive of the endpoints, and the endpoints are independently combinable with each other. Furthermore, the terms "first," "second," and the like, herein do not denote any order, quantity, or importance, but rather are used to denote one element from another.

Likewise, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. In general, an amount, size, formulation, parameter or other quantity or characteristic is "about" or "approximate" whether or not expressly stated to be such.

Although the foregoing disclosure for continuous and uninterrupted 3D printing of PCB's comprising an electromagnetically-shielded tracks and/or components using inkjet printing based on converted 3D visualization CAD/CAM data packages has been described in terms of some embodiments, other embodiments will be apparent to those of ordinary skill in the art from the disclosure herein. Moreover, the described embodiments have been presented by way of example only, and are not intended to limit the scope of the inventions. Indeed, the novel methods, programs, libraries and systems described herein may be embodied in a variety of other forms without departing from the spirit thereof. Accordingly, other combinations, omissions, substitutions and modifications will be apparent to the skilled artisan in view of the disclosure herein.

What is claimed:

1. A method for fabricating a printed circuit board having an electromagnetically-shielded track using inkjet printer comprising:
   a. providing an ink jet printing system comprising:
      i. a first print head having: at least one aperture, an insulating resin ink reservoir, and an insulating resin pump configured to supply the insulating resin inkjet ink through the aperture;
      ii. a second print head having: at least one aperture, a first metallic ink reservoir, and a first metallic ink pump configured to supply the first metallic inkjet ink through the aperture;
      iii. a conveyor, operably coupled to the first, and the second print heads configured to convey a substrate to each of the first, and second print heads; and
      iv. a computer aided manufacturing ("CAM") module, comprising: a data processor; a non-volatile memory; and a set of executable instructions stored thereon for: receiving a visualization file of the printed circuit board having an electromagnetically-shielded track; generating a file that represents at least one, substantially 2D layer for printing the printed circuit board having an electromagnetically-shielded track; receiving a selection of parameters related to the printed circuit board having an electromagnetically-shielded track; and altering the file representing the at least one, substantially 2D layer based on at least one of the selection of parameters, wherein the CAM module is configured to control each of the first, and second print heads;
   b. providing the insulating resin inkjet ink composition, and the first metallic inkjet ink composition;
   c. using the CAM module, obtaining a plurality of generated files, each representing a substantially 2D layer of the printed circuit board having an electromagnetically-shielded track for printing, each substantially 2D layer comprising a pattern representative of the insulating resin inkjet ink, and the first metallic inkjet ink; and
   d. using the first inkjet print head, and the second print head, forming printed circuit board having an electromagnetically-shielded track and/or component wherein the insulating resin ink:
      i. forms a sleeve around a conducting track and wherein the first metallic ink forms a shielding sleeve around the insulating resin sleeve; and/or
      ii. a housing around the conducting track and wherein the first metallic ink forms a shielding capsule around the insulating resin housing.

2. The method of claim 1, wherein the step of using the first inkjet print head, and the second print head, forming printed circuit board having an electromagnetically-shielded track and/or component further comprises:
   a. obtaining a generated file representing a first, substantially 2D layer of the printed circuit board, the 2D layer comprising a pattern representative of the insulating resin inkjet ink, and representative of the first metallic inkjet ink;
   b. using the first print head, forming the pattern corresponding to the insulating resin representation in the first, substantially 2D layer;
   c. curing the pattern corresponding to the insulating resin representation in the 2D layer of the printed circuit board;
   d. using the second print head, forming the pattern corresponding to the shielding metal sleeve representation in the first, substantially 2D layer of the printed circuit board having an electromagnetically-shielded track for printing; and
   e. sintering the pattern corresponding to the shielding metal sleeve representation in the 2D layer of the printed circuit board having an electromagnetically-shielded track.

3. The method of claim 2, further comprising:
   f. obtaining a generated file representing a second substantially 2D layer of the printed circuit board having an electromagnetically-shielded track and/or component for printing subsequent, substantially 2D layer to the first layer, the second, substantially 2D layer comprising a pattern representative of the insulating resin, and the shielding metal;

g. using the first print head, forming the pattern corresponding to the insulating resin representation of the insulating ink in the second, substantially 2D layer of the printed circuit board;

h. curing the pattern corresponding to the insulating resin representation in the second, substantially 2D layer;

i. using the second print head, forming the pattern corresponding to the shielding metal representation in the second, substantially 2D layer of the printed circuit board; and j. sintering the pattern corresponding to the shielding metal representation in the second, substantially 2D layer of the printed circuit board.

4. The method of claim 3, further comprising:

k. obtaining a generated file representing a third substantially 2D layer, the third substantially 2D layer comprising a pattern representative of the conducting track, the insulating sleeve, and the shielding sleeve;

l. using the second print head, forming the pattern corresponding to the conducting track representation in the third substantially 2D layer of the printed circuit board in claim 3 having an electromagnetically-shielded track for printing;

m. sintering the pattern corresponding to the conducting track representation in the third substantially 2D layer of the printed circuit board having an electromagnetically-shielded track for printing;

n. using the first print head, forming the pattern corresponding to the insulating resin representation of the insulating sleeve in the third substantially 2D layer of the printed circuit board in claim 3 having an electromagnetically-shielded track for printing;

o. curing the pattern corresponding to the insulating resin representation in the third substantially 2D layer of the printed circuit board having an electromagnetically-shielded track;

p. using the second print head, forming the pattern corresponding to the shielding metal representation in the third substantially 2D layer of the printed circuit board having an electromagnetically-shielded track for printing; and q. sintering the pattern corresponding to the shielding sleeve representation in the third substantially 2D layer of the printed circuit board having an electromagnetically-shielded track.

5. The method of claim 4, further comprising:

r. obtaining a generated file representing a fourth substantially 2D layer of the printed circuit board having an electromagnetically-shielded track for printing, the fourth substantially 2D layer comprising a pattern representative of the insulating sleeve, and the shielding sleeve;

s. using the first print head, forming the pattern corresponding to the insulating resin representation of the insulating sleeve in the fourth, substantially 2D layer of the printed circuit board having an electromagnetically-shielded track for printing;

t. curing the pattern corresponding to the insulating resin representation in the fourth substantially 2D layer of the printed circuit board having an electromagnetically-shielded track;

u. using the second print head, forming the pattern corresponding to the shielding metal representation in the fourth, substantially 2D layer of the printed circuit board having an electromagnetically-shielded track for printing; and v. sintering the pattern corresponding to the shielding sleeve representation in the fourth substantially 2D layer of the printed circuit board having an electromagnetically-shielded track.

6. The method of claim 1, wherein the inkjet printing system further comprises a third print head having: at least one aperture, a second metallic ink reservoir, and a second metallic ink pump configured to supply a second metallic ink composition through the aperture, the method comprising using the second metallic inkjet to print the shielding sleeve or the conducting track.

7. The method of claim 6, wherein the step of curing the insulating resin comprises heating, photopolymerizing, drying, depositing plasma, cross linking, annealing, facilitating redox reaction, or a combination comprising one or more of the foregoing.

8. The method of claim 7, wherein the metallic ink composition comprises: metal nanoparticles having average diameter $D_{2,1}$ particle size between about 20 nm and about 150 nm; and optionally a solvent.

9. The method of claim 8, wherein the aspect ratio of the metal nanoparticles is substantially more than 1.

10. The method of claim 1, wherein the insulating resin ink composition is a suspension, an emulsion, a solution, or a composition comprising the foregoing.

11. The method of claim 10, wherein the insulating resin ink is a solution of a multifunctional acrylate monomer, oligomer, polymer or their combination; a cross-linking agent; and a radical photinitiator.

12. The method of claim 10, wherein the insulating resin ink is a suspension comprising a suspended colloids of high molecular weight polymer.

13. The method of claim 12, wherein the insulating resin is: polyester (PES), polyethylene (PE), polyvinyl alcohol (PVOH), ply(vinylacetate) (PVA), poly-methyl methacrylate (PMMA), Poly(vinylpirrolidone), or a combination comprising a mixture or a copolymer of one or more of the foregoing.

14. The method of claim 12, wherein the resin ink is a suspension of porous particulates impregnated with a monomer, an oligomer, a polymer or a combination comprising the foregoing, wherein the monomer, oligomer, polymer or a combination thereof has a first terminal end coupled to the porous particulate and a second terminal end having for example, an epoxy functionality, wherein the monomer, oligomer, polymer, or their combination that is operably coupled to the porous particulates are entirely embedded within the particulates and configured to leach out of the porous particulate at a temperature of between about 60° C. and about 150° C.

15. The method of claim 12, wherein the step of using the first print head, and/or the second print head, further comprises providing a support.

16. The method of claim 15, wherein the support is a ceramic powder, a polymer composition, a silicon glass, or a removable support comprising one or more of the foregoing.

17. The method of claim 1, wherein the parameters used in the selection of parameters related to the printed circuit board having an electromagnetically-shielded track and/or component are; pin density, component density, track length, track density, track and/or component layout, the insulating resin pattern in the layer, the insulating sleeve pattern, the shielding sleeve pattern in the layer, the conducting track pattern, curing requirements for the insulating resin and/or sintering for the first and/or second metallic pattern in the layer, the removable support composition, throughput requirement, or a combination of parameters comprising one or more of the foregoing.

18. The method of claim 17, wherein the 3D visualization file representing the printed circuit board having an electromagnetically-shielded track is an .asm, an STL, an IGES, a STEP, a Catia, a SolidWorks, a ProE, a 3D Studio, a Gerber, a Rhino file or a file comprising one or more of the foregoing; and wherein file that represents at least one, substantially 2D layer is a JPEG, a GIF, a TIFF, a BMP, a PDF file, or a combination comprising one or more of the foregoing.

19. The method of claim 1, wherein the inkjet printing system further comprises an additional print head having: at least one aperture, a second insulating resin ink reservoir, and a second insulating resin ink pump configured to supply the second insulating resin ink through the aperture, the method further comprising:
  a. providing a second insulating resin ink composition;
  b. using the second resin ink print head, forming a predetermined pattern corresponding to a second insulating resin representation in the first, substantially 2D layer of the printed circuit board having an electromagnetically-shielded track for printing; and
  c. curing the predetermined pattern corresponding to the second insulating resin representation in the 2D layer of the printed circuit board having an electromagnetically-shielded track;

wherein the second insulating resin ink composition has a different resin composition than the insulating resin ink composition in the first print head and/or has a different color.

20. The method of claim 6, wherein the second metallic ink composition has a different metal than the metallic ink composition in the second print head.

21. The method of claim 20, wherein the inkjet printing system further comprises yet an additional print head having: at least one aperture, a support ink reservoir, and a support ink pump configured to supply the support ink through the at least one aperture, the method further comprising:
  a. providing a support ink composition;
  b. before, simultaneously with, or subsequent to the steps of using the first print head and/or the second and/or any additional print heads, using the support ink print head, forming a predetermined pattern corresponding to a support ink representation in the substantially 2D layer of the printed circuit board having an electromagnetically-shielded track and/or component for printing; and
  c. functionalizing the predetermined pattern corresponding to the support ink representation in the 2D layer of the printed circuit board having an electromagnetically-shielded track and/or component.

* * * * *